United States Patent
Engel et al.

(10) Patent No.: US 7,029,173 B2
(45) Date of Patent: Apr. 18, 2006

(54) THERMOELECTRIC COMPONENT

(75) Inventors: Christine Engel, Kornwestheim (DE); Wolfgang Dressler, Vaihingen/Enz (DE); Alexander Klonczynski, Eppertshausen (DE); Horst Boeder, Sindelfingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/069,680

(22) PCT Filed: Jun. 7, 2001

(86) PCT No.: PCT/DE01/02144

§ 371 (c)(1),
(2), (4) Date: Jul. 17, 2002

(87) PCT Pub. No.: WO01/99204

PCT Pub. Date: Dec. 27, 2001

(65) Prior Publication Data

US 2003/0091092 A1    May 15, 2003

(30) Foreign Application Priority Data

Jun. 21, 2000    (DE) ................. 100 30 354

(51) Int. Cl.
*G01K 7/02*    (2006.01)
*H01L 35/12*    (2006.01)

(52) U.S. Cl. .................... 374/179; 136/236.1

(58) Field of Classification Search ............. 374/179, 374/163, 100; 136/236.1, 203
See application file for complete search history.

(56) References Cited

U.S. PATENT DOCUMENTS

| | | | | |
|---|---|---|---|---|
| 885,430 A * | 4/1908 | Bristol | | 136/239 |
| 971,767 A * | 10/1910 | Marsh | | 136/236.1 |
| 2,094,102 A * | 9/1937 | Fitterer | | 374/179 |
| 2,691,690 A * | 10/1954 | Poch et al. | | 136/239 |
| 2,912,477 A * | 11/1959 | Fischer et al. | | 136/228 |
| 2,981,775 A * | 4/1961 | Bachman | | 374/179 |
| 3,411,956 A * | 11/1968 | Sibley | | 136/236.1 |
| 3,679,471 A | 7/1972 | Wyss | | |
| 3,906,721 A * | 9/1975 | Micheli et al. | | 60/276 |

(Continued)

FOREIGN PATENT DOCUMENTS

DE    195 38 695    4/1996

(Continued)

*Primary Examiner*—Diego Gutierrez
*Assistant Examiner*—Mirellys Jagan
(74) *Attorney, Agent, or Firm*—Kenyon & Kenyon LLP

(57) ABSTRACT

A thermoelectric component includes a first and a second element which, in the vicinity of a contact point, are in contact with each other, e.g., in the form of a thermal contact. Furthermore, in this connection, first element and/or second element have a ceramic material at least in one vicinity of contact point. The component may be suitable as a thermocouple for measuring temperature based on the Seebeck effect, or for use in a Peltier element as a thermoelectric heating element or cooling element based on the Peltier effect.

13 Claims, 1 Drawing Sheet

U.S. PATENT DOCUMENTS

| | | | |
|---|---|---|---|
| 4,032,371 A | | 6/1977 | Andersen |
| 4,105,455 A | * | 8/1978 | Koga et al. ............... 264/125 |
| 4,177,474 A | | 12/1979 | Ovshinsky |
| 4,298,558 A | * | 11/1981 | Baney et al. ............... 501/88 |
| 4,326,039 A | * | 4/1982 | Kriegesmann et al. ........ 501/90 |
| 4,336,215 A | * | 6/1982 | Yajima et al. .............. 264/624 |
| 4,415,758 A | * | 11/1983 | Lacoste et al. .......... 136/236.1 |
| 4,477,686 A | * | 10/1984 | Nakajima et al. ........... 136/203 |
| 4,731,127 A | * | 3/1988 | Itoyama ..................... 136/228 |
| 4,784,313 A | * | 11/1988 | Godziemba-Maliszewski ............... 228/194 |
| 5,009,717 A | * | 4/1991 | Komabayashi et al. ..... 136/201 |
| 5,057,161 A | * | 10/1991 | Komabayashi et al. .. 136/236.1 |
| 5,223,195 A | * | 6/1993 | Kuwabara ................... 264/645 |
| 5,232,286 A | * | 8/1993 | Dubreuil et al. ........... 374/139 |
| 5,246,504 A | | 9/1993 | Ohta et al. |
| 5,332,701 A | * | 7/1994 | Bryson et al. ................ 501/87 |
| 5,507,879 A | * | 4/1996 | Gyoten et al. ........... 136/236.1 |
| 6,225,550 B1 | * | 5/2001 | Hornbostel et al. ...... 136/236.1 |
| 6,271,460 B1 | * | 8/2001 | Yamashita et al. .......... 136/205 |
| 6,710,238 B1 | * | 3/2004 | Shingu et al. ........... 136/236.1 |
| 2003/0092557 A1 | * | 5/2003 | Aichele et al. ............... 501/87 |

FOREIGN PATENT DOCUMENTS

| | | |
|---|---|---|
| EP | 0 412 428 | 2/1991 |
| GB | 900774 | 7/1962 |
| JP | 7-196371 | 8/1995 |
| JP | 8-335721 | 12/1996 |
| JP | 2001226723 A * | 8/2001 |

\* cited by examiner

THERMOELECTRIC COMPONENT

FIELD OF THE INVENTION

The present invention relates to a thermoelectric component, e.g., a thermocouple.

BACKGROUND INFORMATION

In using thermocouples for measuring temperatures, one frequently runs into limits of material load capacity with regard to temperature and application atmosphere. In using thermocouples for a temperature range up to 1500° C. based on PtRh/Pt elements, in extended use above 1000° C., there frequently appears a drift in the thermoelectric voltage, and simultaneously, a considerable deterioration of the mechanical properties on account of creep processes. In particular, during contact with carbon in such thermocouples, often metal carbides will form, which change the Seebeck coefficient and the mechanical properties of the thermocouple. In addition, PtRh/Pt thermocouples are very expensive to produce, and therefore not usable in certain applications.

It is an object of the present invention to make available a thermoelectric component that may be applied, e.g., as a thermocouple, and which may permit making a precise temperature measurement even in ranges of durably high temperatures and/or transient temperature loads, as well as in oxidizing and also reducing gas atmospheres.

SUMMARY

The thermoelectric component according to the present invention may provide the advantage that it has a very good service life and very good constancy in the thermoelectric voltage that occurs, even at high temperatures and reactive gas atmospheres, a typical service life being considered to be five years. In particular, the thermoelectric component according to the present invention, when used as a thermocouple, permits making temperature measurements of up to 1300° C. as well as in an oxidizing and also in a reducing atmosphere, at a precision of less than ±10° C. The thermoelectric component may have a short response time to temperature changes, which is typically less than one second.

Besides that, the thermoelectric component according to the present invention may be constructed in a small size, so that with it, microstructured thermocouples or microstructured thermoelectric components may be made. A microstructured component is understood to mean a component, the element of which has typical dimensions in the micrometer range.

Because of its good temperature stability and resistance with respect to reactive gas atmospheres, in the thermoelectric component according to the present invention, one may furthermore do without a ceramic or metallic protective tube, so that its use as a thermocouple makes possible accurate and, at the same time, fast temperature measurement.

The thermoelectric component according to the present invention may provide the advantage of a long service life expectation, even in reactive gas atmospheres, at simultaneously high temperature resolution and rapid response time. Beyond that, it can be manufactured cost-effectively and, particularly when used as a thermocouple, it has typical thermoelectric voltages in the mV range, which are easily measurable.

Thus, the thermoelectric component is not only suitable as a thermocouple, but by impressing an external current upon it in a conventional manner, it may also be configured as a Peltier element, in order to make it into, for example, a thermoelectric heating element or cooling element.

The element of the thermoelectric component may be made of a first ceramic material and a second ceramic material differing from the first, of which at least one may include additionally one or more suitable filler materials. In this fashion, the occurring contact voltages are clearly increased, because of the Seebeck effect. Especially suitable as filler material, e.g., for one of the elements, is a filler material having at least approximately metallic conductivity, and on the other hand, for the other element, an electrically semiconductive or insulating filler material.

In realizing the first and/or the second element of the thermoelectric component, the ceramic material of at least one element may be obtained by pyrolysis of a polymeric precursor material or a polymeric precursor material provided with one or more filler materials. In this connection, by the selection of the polymeric precursor material, and by the type and proportion of the filler materials in this precursor material, in an especially simple manner, the thermal coefficients of expansion of the elements of the thermoelectric component may be adapted to each other.

The thermoelectric component may also be realized in that, in at least one vicinity of the contact location, just one element is made of a ceramic material, while the second element is made of a metal that may be soldered.

The present invention is explained in greater detail with reference to the drawings and in the following description.

DETAILED DESCRIPTION

The example embodiments further explained, first of all relate to polymeric precursor materials, provided with filler materials, which are convertible into ceramic materials by pyrolysis. Such precursor materials or filler materials, respectively, are described in European Published Patent Application No. 0 412 428 or in German Published Patent Application No. 195 38 695, which also describe that one may produce molded articles using pyrolysis, by the addition of filler materials to the polymeric precursor materials used. In this connection, the specific resistance of the ceramic molded articles obtained may be set both by the choice of the filler materials and by the choice of the polymeric precursor material.

As the polymeric precursor materials for the example embodiments which are further explained, polymers may be suitable which are convertible by pyrolysis into ceramic materials based on Si—C compounds, Si—C—N compounds, Si—Ti—C—O compounds, Si—C—O compounds, Si—B—C—N compounds, Si—B—C—O compounds, B—C—N compounds, Si—Al—C—O compounds, Si—Al—N—C—O compounds or Si—C—O—N compounds.

As filler materials in these polymeric precursor materials or the ceramic materials obtained after pyrolysis, respectively, filler materials are suitable which have at least approximately metallic conductivity such as $MoSi_2$, $Cr_3C_2$, TiC, WC, TiN, FeCr, FeCrNi, ZrN or ZrC. Besides those, or alternatively to them, an electrically semiconductive or insulating filler material such as $Al_2O_3$, SiC, $B_4C$, BN, $ZrO_2$, $SiO_2$, $Si_3N_4$ or graphite also come into consideration as filler material.

As a low-ohm, high temperature-stable filler material having approximately metallic conductivity, e.g., molybdenum disilicide having a specific electrical resistance of $2\times10^{-5}$ $\Omega cm$ and a positive temperature coefficient of the electrical resistance of $5\times10^{-1}$ $K^{-1}$ may be suitable.

As a high-ohm insulating, high temperature stable filler material, $Al_2O_3$ may be used, having a specific electrical resistance of more than $10^{11}$ $\Omega cm$ at room temperature, which is combined with a ceramic material based on an Si—O—C compound as a conductivity carrying phase, the specific electrical resistance of which after pyrolysis at 1400° C. about 2 $\Omega cm$.

Figure 1:
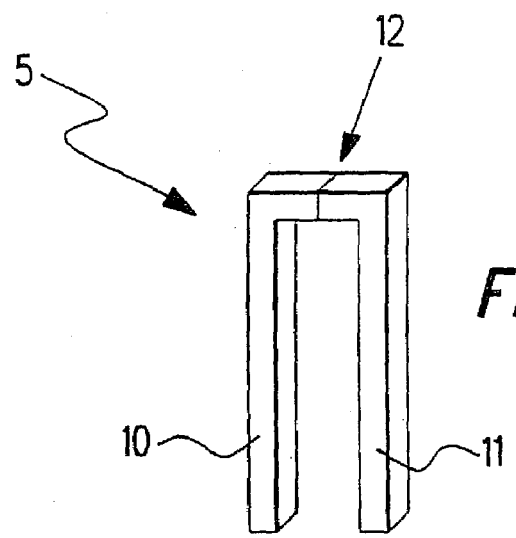
FIG. 1 is a perspective view of a thermoelectric component in the form of a thermocouple.

A first example embodiment of the present invention is explained with reference to FIG. 1. FIG. 1 illustrates a thermoelectric component in the form of a thermocouple 5, which has a first element 10 and a second element 11 which are connected to each other by a contact point 12 in the form of a thermal contact. It is further provided that thermocouple 5 is interconnected with a device for measuring the contact voltage. Thermocouple 5 is used for measuring a temperature to which contact point 12 is exposed. This temperature typically is in the range of 0° C. to 15000° C.

Figure 2:
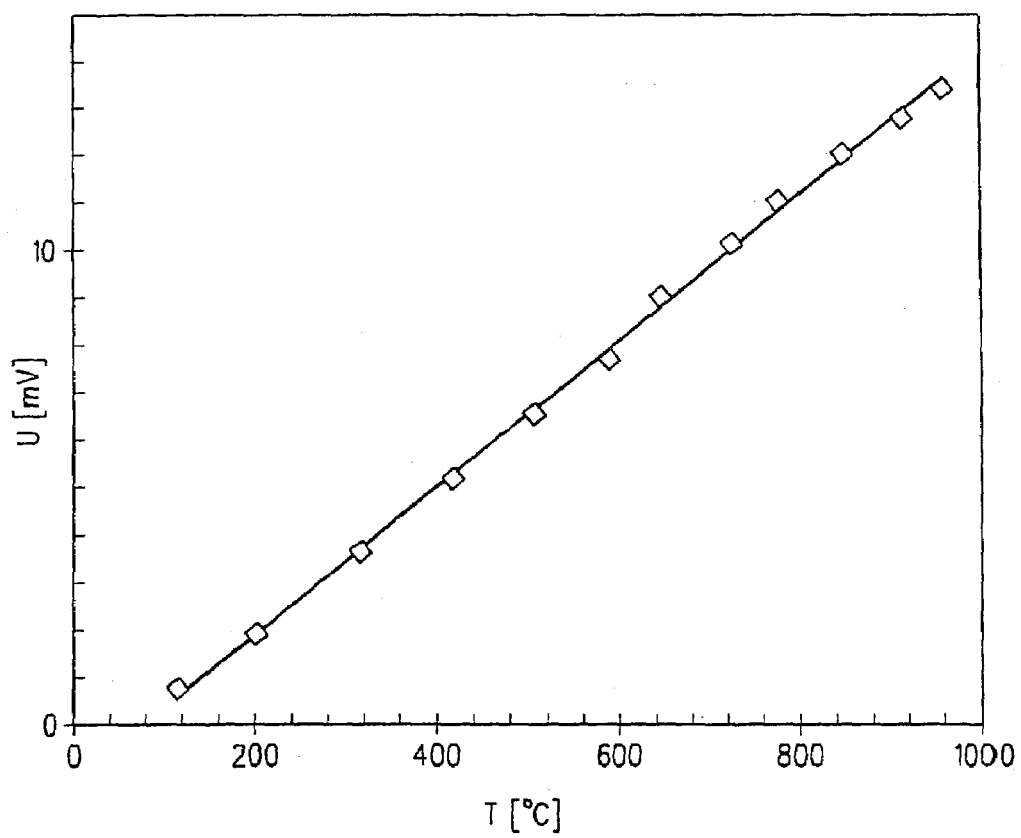
FIG. 2 is a graph of the contact voltage or the thermoelectric voltage near the contact location of the two elements of the thermocouple as a function of the temperature at the contact point.

FIG. 2 illustrates the plot of thermoelectric voltage which occurs in the vicinity of contact point 12 of thermocouple 5, as a function of the temperature to which contact point 12 is exposed. One may see from FIG. 2 that the thermoelectric voltage that appears, is in the mV range, and that, in the range of approximately 50° C. to 1000° C., it is a linear function of the temperature.

In the example embodiment explained, thermocouple 5 in its two elements 10, 11 further includes a single pyrolysis ceramic filled, however, with two different filler materials, the electrical properties of which with regard to the Seebeck coefficient and the specific electrical resistance of first element 10 and second element 11 have each been set specifically by the type of the filler material.

The shaping of thermocouple 5 before the pyrolysis was done using familiar manufacturing processes of plastic methodology, such as transfer molding, injection molding or hot pressing.

Especially important for the functioning of thermocouple 5 may be the vicinity of contact point 12 in which the two materials of first element 10 and second element 11 meet each other. In this contact area, in which the thermoelectric voltage appears, it may be important that the two materials of the first and the second element 10, 11 each be as homogeneous as possible in the vicinity of contact point 12.

During pyrolysis of the first used polymeric precursor materials, which form elements 10, 11, in order to avoid having different shrinkages in first element 10 or second element 11 occur, which may lead, particularly in the area of contact point 12, to cracks and thereby malfunctioning of the thermoelectric component, it is further provided, in an example embodiment, that the materials employed before the pyrolysis be adapted to one another with respect to the shrinkage appearing during pyrolysis. This adaptation may be made by the selection of the filler materials and their proportion in each polymeric precursor material.

In addition to the adaptation with respect to shrinkage, it may be provided further that the thermal coefficients of expansion of the material of the first element 10 and the material of the second element 11 be adapted to each other, so as to minimize or avoid stresses and/or cracks in the area of contact point 12 during the operation of thermocouple 5.

Within the framework of the explained example embodiment, the electromotive force or the Seebeck coefficient of the materials of first element 10 and of second element 11 is set only by the type of filler material used, whereas both elements 10, 11 are otherwise made of the same polymeric precursor material before the pyrolysis. Thus, for one of the elements 10, 11 of thermocouple 5, molybdenum silicide is used as high temperature-resistant filler material, having approximately metallic conductivity. In that case, electrically semiconductive or insulating filler materials, such as aluminum oxide or graphite may be used. In addition, however, it is also possible to make one of the two elements 10, 11 of thermocouple 5 completely of a metal that may be soldered, such as Vacon (manufacturer: VAC Vakuumschmelze) that is, a Ni—Co alloy having a low thermal coefficient of expansion. In that case, the second element of thermocouple 5 is made of the ceramic material which is filled with one of the filler materials discussed.

An alternative example embodiment of thermocouple 5 provides that, as materials for first element 10 or second element 11 two different polymeric precursor materials be used, which will be present after pyrolysis in the form of two different ceramic materials, such as a Si—Ti—C—O compound on the side of element 10 and a Si—C—O compound on the side of the other element 11.

In this case, contact point 12 is composed in the form of a thermal contact having a thermal voltage appearing for a thermocouple 5 from adjacent pyrolytic ceramics of different composition, e.g., having different filler materials.

Besides the kind of filler material, alternatively or additionally to the preceding example embodiments, the proportion of the filler material in the polymeric precursor material(s) used may also be varied, so as to set the thermoelectric and the mechanical properties in this fashion, e.g., the Seebeck coefficient in contact area 12 of the thermocouple 5 so obtained.

The entire filler material content is between 10% by volume and 50% by volume, in relation to the volume of the initial blank present before the pyrolysis, including the polymeric precursor materials discussed.

The thermal voltage or the Seebeck coefficient, appearing in the area of contact point 12, may also be set, within certain limits, by the method parameters during pyrolysis, in all the preceding example embodiments.

Subsequently, an example embodiment for producing a thermocouple 5 illustrated in FIG. 1 will now be explained in greater detail. Alternative example embodiments may be realized in view of European Published Patent Application No. 0 412 028 or German Published Patent Application No. 195 38 695, by varying the type and the amount of the filler materials used, or of the polymeric precursor compounds used.

To begin with, 53.1 g pulverulent condensation-crosslinked polymethylsiloxane and 46.9 g $Al_2O_3$ powder are placed in a grinding mill per 1000 g of steel grinding balls. This corresponds to a filling ratio of 20% by volume of $Al_2O_3$ with respect to the polymer filler material mixture. After a grinding time of 5 minutes, the powder mixture obtained is separated from the steel balls and screened using a 150 μm sieve. Subsequently, the screened powder mixture is filled into a mold and is cold-molded at a pressure of 150 MPa. The first powder mixture is thus used as a first polymeric precursor material furnished with a first filler material, from which subsequently first element 10 of thermocouple 5 will be formed.

For second element 11 of thermocouple 5, likewise, to begin with, 35.3 g pulverulent, condensation-cross-linked polymethylsiloxane and 64.7 g molybdenum silicide are used per 1000 g of steel grinding balls. This corresponds to a filling ratio of 25% by volume of molybdenum silicide with respect to the polymer filler material mixture. After grinding and screening, which is performed as described above, the powder mixture is then filled, as second polymeric precursor material furnished with a second filler material, into the mold, in which there is already the material for first element 10. After a cold-mold procedure at 150 MPa, the material junction thus obtained is next age-hardened for 30 minutes at a pressure of 10 MPa and a temperature of 170° C.

Subsequently, U-shaped molded articles as in FIG. 1 are separated out (of the mold), which are then pyrolyzed according to the following temperature program under a flowing argon atmosphere having an argon flow of 5 l/min. Thermocouple 5 obtained from this temperature program has a thermal voltage which is in the thermal voltage range of known thermocouples based on PtPh/Pt. The temperature dependence of the occurring thermal voltage of thermocouple 5 that is obtained is shown in FIG. 2.

| Heating Rate/<br>Cooling Rate (° C./h) | Final Temperature<br>(° C.) | Retention Time<br>(hours) |
| --- | --- | --- |
| 300 | 300 | 0 |
| 20 | 900 | 0 |
| 80 | 1400 | 1 |
| 150 | 20 | — |

Thermocouple 5 as in FIG. 1 has typical dimensions of width of elements 10, 11 of 10 μm to 1 cm and a thickness of elements 10, 11 of 1 μm to 1 cm. Furthermore, the typical length of elements 10, 11 is in the range of 1 cm and more. The distance apart of the first and second element 10, 11 in the region of thermocouple 5, in which these two elements 10, 11 extend parallel to each other, is between 50 μm and 5 cm. Thermocouple 5 may thus be made even as a microstructured thermocouple having typical dimensions in the micrometer range. Besides, it is clear that, instead of a thermocouple 5, a thermoelectric component in the form of a Peltier element may also be made in the manner explained above. Then too, more than one contact point 12 may be provided, which are made of relevant material combinations for elements 10, 11 that define these contact points 12.

The geometry of thermocouple 5 may not be limited to the U-shape explained with reference to FIG. 1, i.e., there are other geometries too, and other dimension of the thermoelectric component which may be realized, according to the response time desired.

What is claimed is:

1. A thermoelectric component, comprising:
   a first element; and
   a second element;
   wherein the first element and the second element are in contact with each other in an area of at least one contact point; and
   wherein at least in one vicinity of the contact point, at least one of the first element and the second element includes a ceramic material, wherein at least in one vicinity of the contact point, the ceramic material includes a filler of one of FeCr and FeCrNi.

2. The thermoelectric component according to claim 1, wherein the thermoelectric component includes a thermocouple.

3. The thermoelectric component according to claim 1, wherein at least in one vicinity of the contact point, the first element includes a first ceramic material and the second element includes a solderable metal.

4. The thermoelectric component according to claim 1, wherein the filler material includes at least one of a filler material having an at least approximately metallic conductivity, an electrically semiconductive filler material and an insulating filler material.

5. The thermoelectric component according to claim 1, wherein a material of the first element and a material of the second element have an at least approximately equal thermal coefficient of expansion at least in the vicinity of the contact point.

6. The thermoelectric component according to claim 1, wherein in at least one vicinity of the contact point, a material of the first element and a material of the second element are configured so that at the contact point one of a contact voltage occurs in accordance with a Seebeck effect and a temperature change occurs in response to an impressed external electric current in accordance with a Peltier effect.

7. The thermoelectric component according to claim 6, wherein the first element and the second element electrically interconnect with one of a device configured to measure the contact voltage and a device configured to impress an external electric current flowing through the contact point.

8. The thermoelectric component according to claim 1, wherein at least in one vicinity of the contact point, the first element includes a first ceramic material and the second element includes a second ceramic material different from the first ceramic material.

9. The thermoelectric component according to claim 8, wherein at least one of the first ceramic material and the second ceramic material includes obtained by pyrolysis of one of a polymeric precursor material and a polymeric precursor material that includes at least one filler material.

10. The thermoelectric component according to claim 8, wherein at least one of the first ceramic material and the second ceramic material includes a ceramic material based on one of Si—C compounds, Si—C—N compounds, Si—Ti—C—O compounds, Si—C—O compounds, Si—B—C—N compounds, Si—B—C—O compounds, B—C—N compounds, Si—Al—C—O compounds, Si—Al—N—C—O compounds and Si—C—O—N compounds.

11. The thermoelectric component according to claim 8, wherein the first ceramic material is obtained by pyrolysis of one of a first polymeric precursor material and a first polymeric precursor material that includes a first filler material and the second ceramic material is obtained by pyrolysis of one of a second polymeric precursor material and a second polymeric precursor material that includes a second filler material.

12. The thermoelectric component according to claim 11, wherein the first polymeric precursor material and the second polymeric precursor material are configured so that, in response to pyrolysis of the precursor materials, an at least approximately equal shrinkage occurs at least in the vicinity of the contact point.

13. A method, comprising the steps of:

providing a thermoelectric component, the thermoelectric component including a first element and a second element, the first element and the second element arranged in contact with each other in an area of at least one contact point, at least in one vicinity of the contact point, at least one of the first element and the second element including a ceramic material, wherein the ceramic material includes a filler of one of FeCr and FeCrNi; and arranging the thermoelectric component in one of a thermocouple configured to one of measure temperature and a Peltier element as one of a thermoelectric heating element and a cooling element.

\* \* \* \* \*